United States Patent
Tahmasebi et al.

(10) Patent No.: US 9,923,137 B2
(45) Date of Patent: *Mar. 20, 2018

(54) MAGNETIC MEMORY WITH TUNNELING MAGNETORESISTANCE ENHANCED SPACER LAYER

(71) Applicant: GLOBALFOUNDRIES Singapore Pte. Ltd., Singapore (SG)

(72) Inventors: Taiebeh Tahmasebi, Singapore (SG); Kangho Lee, San Diego, CA (US); Vinayak Bharat Naik, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/060,634

(22) Filed: Mar. 4, 2016

(65) Prior Publication Data

US 2016/0260891 A1  Sep. 8, 2016

Related U.S. Application Data

(60) Provisional application No. 62/128,534, filed on Mar. 5, 2015.

(51) Int. Cl.
*H01L 43/08* (2006.01)
*H01L 43/02* (2006.01)
(Continued)

(52) U.S. Cl.
CPC ............ *H01L 43/08* (2013.01); *G11C 11/161* (2013.01); *H01L 43/02* (2013.01); *H01L 43/10* (2013.01); *H01L 43/12* (2013.01)

(58) Field of Classification Search
CPC ......... H01L 43/08; H01L 43/02; H01L 43/12; H01L 43/10; G11C 11/161
(Continued)

(56) References Cited

U.S. PATENT DOCUMENTS

2009/0147392 A1* 6/2009 Prejbeanu ............... G11C 11/16
360/59
2009/0261434 A1* 10/2009 Kang ..................... H01L 43/08
257/421
(Continued)

FOREIGN PATENT DOCUMENTS

WO    2012154411 A1    11/2012

OTHER PUBLICATIONS

Adrien Le Goff et al., Effect of Ta Insertion in Reference Layers of MTJs With Perpendicular Anisotropy, IEEE Transactions on Magnetics, Nov. 2014, vol. 50, No. 11.
(Continued)

*Primary Examiner* — Bo Fan
(74) *Attorney, Agent, or Firm* — Horizon IP Pte Ltd.

(57) ABSTRACT

A device and a method of forming a device are presented. A substrate is provided. The substrate includes circuit component formed on a substrate surface. Back end of line processing is performed to form an upper inter level dielectric (ILD) layer over the substrate. The upper ILD layer includes a plurality of ILD levels. A magnetic tunneling junction (MTJ) stack is formed in between adjacent ILD levels of the upper ILD layer. The MTJ stack comprises a free layer, a tunneling barrier layer and a fixed layer. The fixed layer includes a polarizer layer, a composite texture breaking layer which includes a ruthenium layer and a synthetic antiferromagnetic (SAF) layer.

20 Claims, 10 Drawing Sheets

(51) Int. Cl.
  *H01L 43/10* (2006.01)
  *H01L 43/12* (2006.01)
  *G11C 11/16* (2006.01)

(58) Field of Classification Search
  USPC .......................................................... 257/421
  See application file for complete search history.

(56) References Cited

U.S. PATENT DOCUMENTS

| | | | |
|---|---|---|---|
| 2010/0072566 A1* | 3/2010 | Kang | H01L 43/08 257/422 |
| 2012/0205759 A1 | 8/2012 | Hu | |
| 2012/0267733 A1* | 10/2012 | Hu | G11C 11/16 257/421 |
| 2013/0075839 A1* | 3/2013 | Chen | H01L 43/08 257/421 |
| 2013/0187248 A1* | 7/2013 | Kariyada | H01L 43/02 257/425 |
| 2014/0027869 A1 | 1/2014 | Lee et al. | |
| 2014/0117476 A1* | 5/2014 | Kuo | H01L 43/08 257/421 |
| 2015/0008550 A1 | 1/2015 | Min et al. | |
| 2015/0171316 A1* | 6/2015 | Park | H01L 43/10 257/421 |

OTHER PUBLICATIONS

Maria Patricia Rouelli Sabino et al., Influence of Ta insertions on the magnetic properties of MgO/CoFeB/MgO films probed by ferromagnetic resonance, Japan Society of Applied Physics, 2014.

D. C. Worledge et al., Spin torque switching of perpendicular Ta CoFeB MgO-based magnetic tunnel junctions, 2011, Applied Physics Letter 98, 022501, USA.

Matthias Gottwald et al., ParamagneticFexTa1-x alloys for engineering of perpendicularly magnetized tunnel junctions, APL Materials, 2013, vol. 1, Issue 2, USA.

Lea Cuchet et al., Influence of a Ta spacer on the magnetic and transport properties of perpendicular magnetic tunnel junctions, 2013, Applied Physics Letters 103, 052402, AIP Publishing.

T. Liu et al., "Thermally robust Mo/CoFeB/MgO trilayers with strong perpendicular magnetic anisotropy", Scientific Reports, 2014.

Di Wu et al., "Enhancement of perpendicular magnetic anisotropy in Co/Ni multilayers by in situ annealing the Ta/Cu under-layers", Applied Physics Letters, 2013, vol. 103, No. 24, AIP Publishing.

H. Kurt et al., "Enhanced perpendicular magnetic anisotropy in Co/Ni multilayers with a thin seed layer", Journal of Apllied Physics, 2010, vol. 108, No. 7, AIP Publishing.

L. You et al., "Co/Ni multilayers with perpendicular anisotropy for spintronic device applications", 2012, Applied Physics Letter, vol. 100, No. 172411, American Institute of Physics.

* cited by examiner

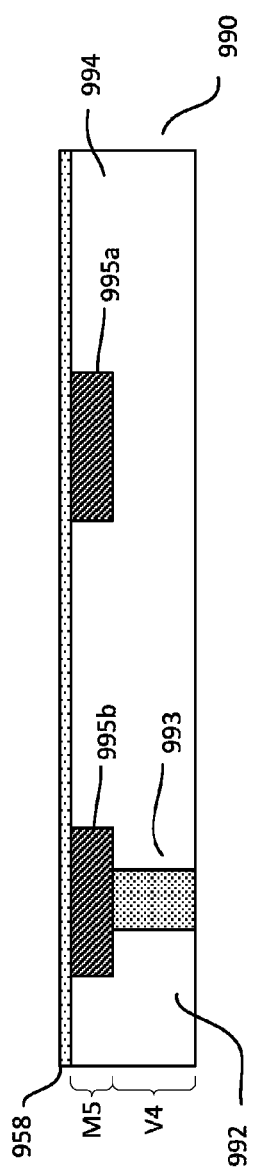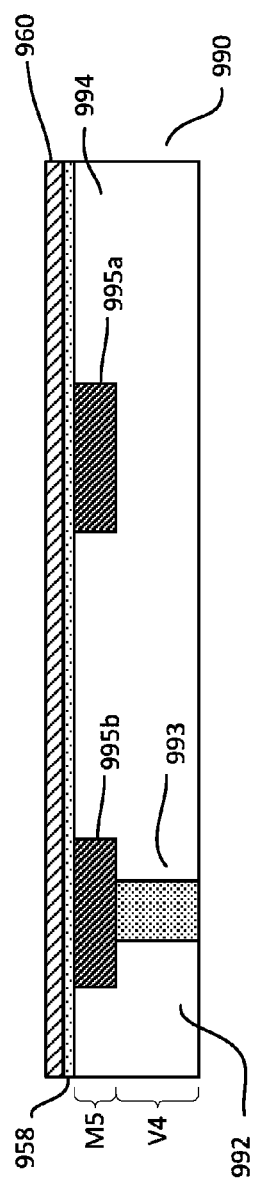

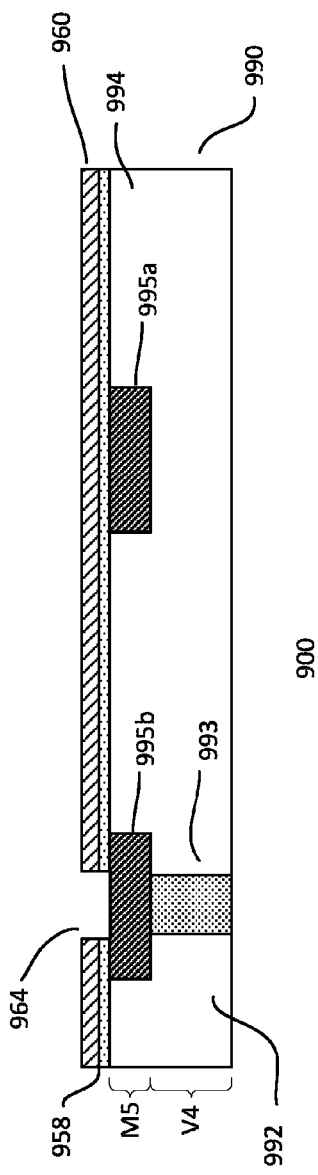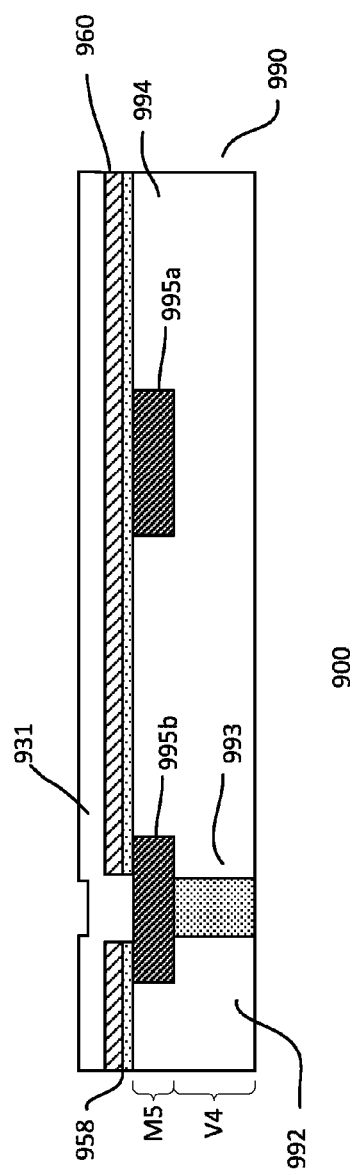

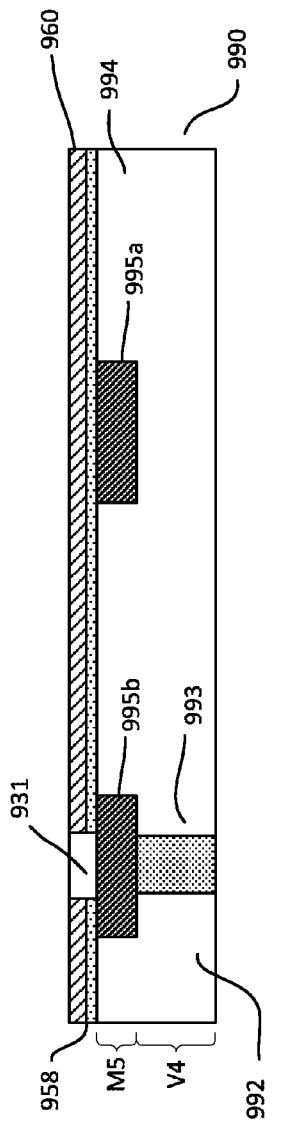
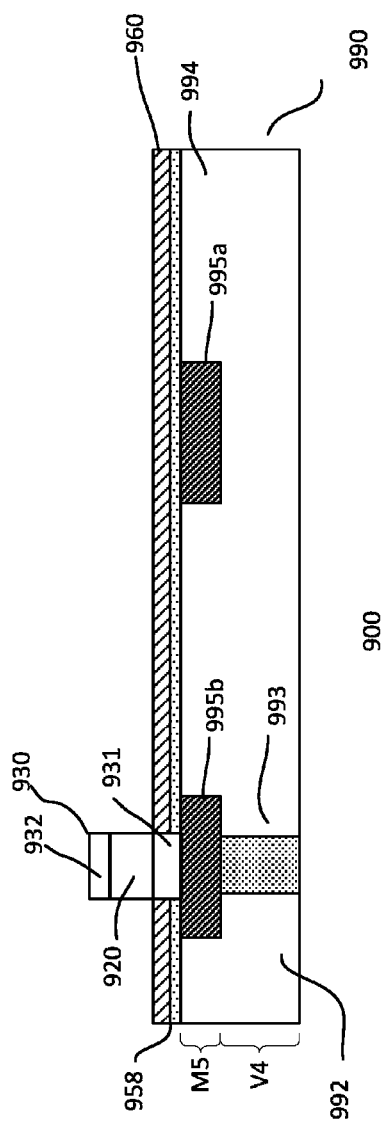

MAGNETIC MEMORY WITH TUNNELING MAGNETORESISTANCE ENHANCED SPACER LAYER

CROSS-REFERENCE TO RELATED APPLICATION

This application claims the priority benefit of U.S. Provisional Application Ser. No. 62/128,534, filed on Mar. 5, 2015, which is herein incorporated by reference in its entirety.

BACKGROUND

A magnetic memory cell or device stores information by changing electrical resistance of a magnetic tunnel junction (MTJ) element. The MTJ element typically includes a thin insulating tunnel barrier layer sandwiched between a fixed ferromagnetic layer and a free ferromagnetic layer, forming a magnetic tunnel junction. The resistance state of the MTJ element changes corresponding to that of the magnetic orientation of the free layer relating to the fixed layer, which may be in either a parallel (P) state or an anti-parallel (AP) state. The corresponding electrical resistance between the free layer and the fixed layer in P state is denoted as $R_P$ while the corresponding electrical resistance between the free layer and the fixed layer in AP state is denoted as $R_{AP}$. The performance of an MTJ element is usually characterized by its tunneling magnetoresistance (TMR), which may be calculated using the formula given by $(R_{AP}-R_P)/R_P$. For example, a larger TMR ratio facilitates read operations in a magnetic memory cell. Thus, an enhanced TMR is necessary for realizing next-generation magnetic memory cells.

It is desirable to provide a reliable memory device with an enhanced TMR ratio and method for forming a reliable memory device which eliminates the high temperature concern for the MTJ element. Furthermore, it is also desirable that the process is cost effective and compatible with logic processing.

SUMMARY

Embodiments of the present disclosure generally relate to semiconductor device and method for forming a semiconductor device. In one embodiment, a method of forming a device is disclosed. A substrate is provided. The substrate includes circuit component formed on a substrate surface. Back end of line processing is performed to form an upper inter level dielectric (ILD) layer over the substrate. The upper ILD layer includes a plurality of ILD levels. A magnetic tunneling junction (MTJ) stack is formed in between adjacent ILD levels of the upper ILD layer. The MTJ stack includes a free layer, a tunneling barrier layer and a fixed layer. The fixed layer includes a polarizer layer, a composite texture breaking layer which includes a ruthenium layer and a synthetic antiferromagnetic (SAF) layer.

In another embodiment, a device is presented, the device includes a substrate having circuit component formed on a substrate surface. An upper inter level dielectric (ILD) layer is disposed over the substrate. The upper ILD layer includes a plurality of ILD levels. A magnetic tunneling junction (MTJ) stack is disposed in between adjacent ILD levels of the upper ILD layer. The MTJ stack includes a free layer, a tunneling barrier layer and a fixed layer. The fixed layer includes a polarizer layer, a composite texture breaking layer which includes a ruthenium layer and a synthetic antiferromagnetic (SAF) layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 9a-9h show cross-sectional views of an embodiment of a process for forming a memory cell.

DETAILED DESCRIPTION

Embodiments of the present disclosure generally relate to memory cells or devices. In one embodiment, the memory cells are magnetoresistive memory cells. For example, the memory devices may be spin transfer torque magnetoresistive random access memory (STT-MRAM) devices. A magnetoresistive memory cell includes a magnetic tunneling junction (MTJ) storage unit. The MTJ storage unit of the present disclosure includes a composite spacer layer that provides sustainable or enhanced TMR at high annealing temperature, for example, 400° C. during back-end-of-line (BEOL) processing. Other suitable types of memory cells may also be useful. Such memory devices, for example, may be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

Figure 1:
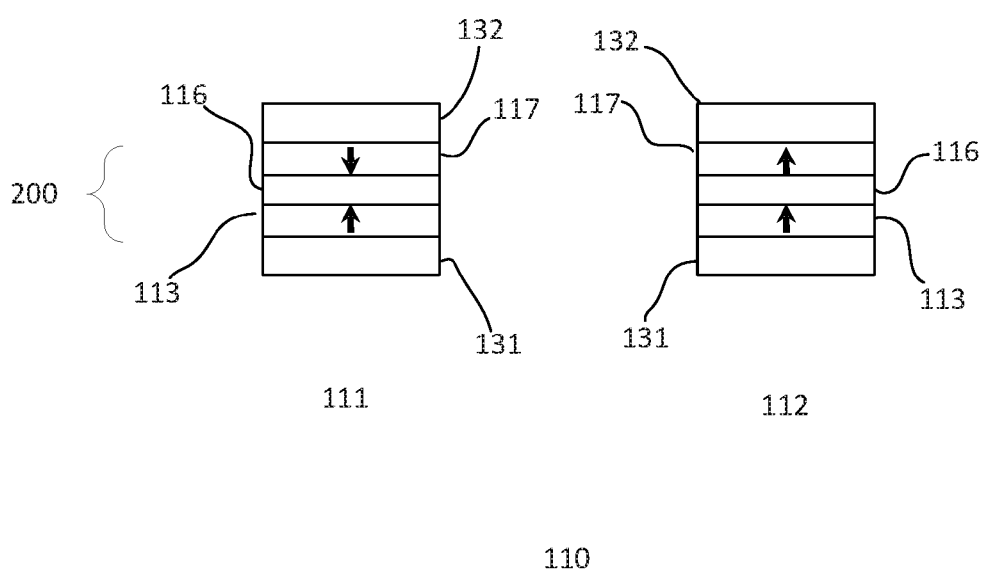
FIG. 1 shows simplified diagrams of parallel state and anti-parallel state of a bottom pinned perpendicular MTJ module of a magnetic memory cell.

FIG. 1 shows a simplified cross-sectional view of an embodiment of a bottom pinned perpendicular MTJ (pMTJ) unit or module 110 of a magnetic memory cell. The MTJ module includes a pMTJ element or stack 200 disposed between a bottom electrode 131 and a top electrode 132. The bottom electrode 131 is proximate to the substrate on which the memory cell is formed while the top electrode 132 is distal from the substrate.

The MTJ element includes a magnetically fixed (pinned) layer 113, a tunneling barrier layer 116 and a magnetically free layer 117. In one embodiment, the magnetically fixed layer 113 is disposed below the magnetically free layer 117, forming a bottom pinned pMTJ stack. The magnetic orientation or magnetization of the fixed layer 113 is fixed in a first perpendicular direction. The term perpendicular direction, for example, refers to the direction which is perpendicular to the surface of a substrate or perpendicular to the plane of the layers of the MTJ module. As shown, the first perpendicular direction is in an upward direction away from the substrate. Providing the first perpendicular direction which is in a downward direction towards the substrate may also be useful. As for the magnetic orientation or magnetization of the free layer 117, it may be programmed to be in a first or same direction as the fixed layer 113 or in a second or opposite direction as the fixed layer 113.

For example, as shown by structure 111, the magnetic orientation or magnetization of the free layer 117 is programmed to be in the second or anti-parallel direction to the fixed layer 113. The corresponding MTJ electrical resistance between the free layer 117 and the fixed layer 113 is denoted as $R_{AP}$. Structure 112 illustrates that the magnetic orientation of the free layer 117 is programmed to be in the first or parallel direction to the fixed layer 113. The corresponding MTJ electrical resistance between the free layer 117 and the fixed layer 113 is denoted as $R_P$. The resistance $R_{AP}$ is higher than the resistance $R_P$.

Figure 2:
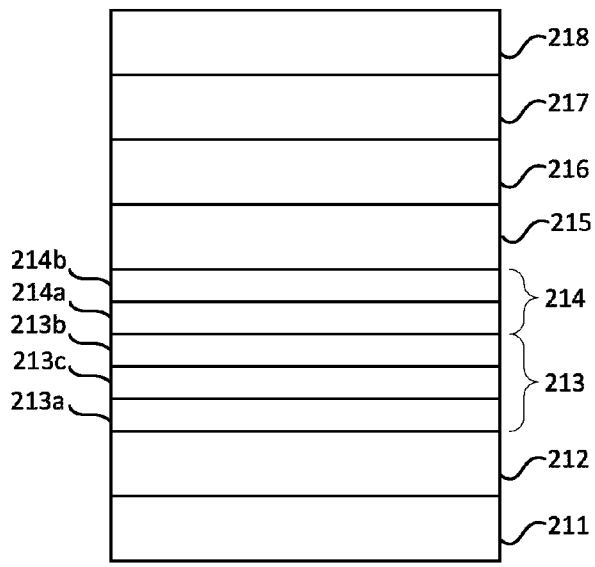
FIG. 2 shows a cross sectional view of an embodiment of a perpendicular MTJ module of a magnetic memory cell.

FIG. 2 shows a simplified cross-sectional view of an embodiment of a pMTJ element or stack 200 of FIG. 1 along a bitline direction (x-axis). The pMTJ stack is a stack of layers including a seed layer 211, a bias layer 212, a magnetically fixed (pinned) layer, a tunneling barrier layer 216, a magnetically free layer 217 and a cap layer 218. The magnetically fixed layer includes a synthetic antiferromagnetic (SAF) layer 213, a texture breaking layer 214 and a polarizer layer 215. The layers forming the pMTJ stack are sequentially formed on the seed layer 211. The seed layer 211, for example, enables a smooth and dense packed growth of the subsequently formed layers. The seed layer 211 may be a metal layer, for example, Ta, Pt, Ru, NiFe or NiCr.

The bias layer 212 is an antiferromagnetic (AFM) layer. For example, the AFM layer 212 may be a multilayer of Co, Pt, Pd, Ni based metal.

The SAF layer 213 is disposed on the bias layer 212. The SAF layer may include a first magnetic layer 213a, a second magnetic layer 213b and a coupling layer 213c. The first and second magnetic layers have opposite magnetizations and are separated by the coupling layer 213c. The first magnetic layer 213a is coupled to the bias layer 212. The coupling layer 213c is disposed on the first magnetic layer 213a and the second magnetic layer 213b is disposed on the coupling layer 213c. Since the magnetic layers are antiparallel coupled, a closure of the magnetic flux is formed within. As a result, stray magnetic field influences on the free layer 217 are minimized.

The magnetizations of the first and second magnetic layers are "pinned" via a direct exchange-bias coupling to the bias layer 212, so that the magnetizations of the first and second magnetic layers does not flip (rotate) in the presence of an applied magnetic field. The magnetization or magnetic orientation in the second magnetic layer 213b proximate to the free layer 217 acts as a fixed reference to the free layer 217.

The first and second magnetic layers of the SAF layer 213 may be an alloy magnetic layer or a multilayer. For example, the magnetic layers 213a and 213b may be a cobalt-iron-boron (CoFeB) alloy or a cobalt-iron (CoFe) alloy, or a multilayer of cobalt/platinum (Co/Pt), cobalt/palladium (Co/Pd) or cobalt/nickel (Co/Ni). The first magnetic layer 213a may be thicker than the second magnetic layer 213b. For example, the first magnetic layer 213a may include n layer of Co/Pt, Co/Pd or Co/Ni, and the second magnetic layer 213b may include m layer of Co/Pt, Co/Pd or Co/Ni, wherein n is an integer larger than m. In one embodiment, n and m may be less than 20 layers.

In one embodiment, the first and second magnetic layers of the SAF layer 213 may be arranged in the (111) plane of a face centered cubic (fcc) crystal structure. Other fcc orientations of the first and second magnetic layers of the SAF layer 213 may also be useful.

As for the coupling layer 213c, it may be a non-magnetic conductor. For example, the coupling layer 213c may be a ruthenium (Ru) layer. The Ru layer may be sufficiently thin.

The texture breaking layer 214 is disposed on the SAF layer 213. The texture breaking layer 214 may be a composite spacer layer. The composite spacer layer may include a first spacer layer 214a and a second spacer layer 214b. The first spacer layer 214a is proximate to the SAF layer 213, whereas the second spacer layer 214b is distal from the SAF layer 213. In one embodiment, the first spacer layer 214a may be a less diffusive metal, for example, ruthenium (Ru). The second spacer layer 214b may be a metal, for example, tantalum (Ta). The tantalum layer may, in one embodiment, be an amorphous layer. The thickness of the breaking layer 214 is sufficiently thin, e.g., from 2 to 10 Å, so as to provide a strong magnetic coupling between the SAF layer 213 and polarizer layer 215.

The Ru spacer layer 214a which is proximate to the SAF layer 213 serves as a boron getter during annealing processes, preventing the formation of borides in the MTJ stack which degrades the device performance. Furthermore, the presence of the Ru spacer layer 214a in the composite spacer layer 214 also reduces the thickness of the Ta spacer layer 214b. Since tantalum is a highly diffusive metal at high annealing temperature, such a reduction in tantalum thickness further ensures the diffusivity of tantalum is reduced. As a result, an improved thermal budget and TMR can be achieved.

The texture breaking layer 214 governs the growth of the subsequently formed layer. For example, the amorphized Ta spacer layer 214b of the texture breaking layer 214 breaks the texture from underneath, i.e., the crystallinity of the SAF layer 213, enabling the growth of an amorphous layer. Therefore, the subsequently formed layer, i.e., the polarizer layer, is highly disordered, resulting in an enhanced TMR.

The polarizer layer 215 is disposed on the texture breaking layer 214. The polarizer layer 215 includes an amorphous layer. In one embodiment, the polarizer layer 215 may be a amorphized CoFeB layer. The amorphous layer enhances the tunnel magnetoresistance (TMR) effect of the MTJ stack.

The tunneling barrier layer 216 is disposed on the polarizer layer 215. The tunneling barrier layer 216 is a non-magnetic and electrically insulating layer. The tunneling barrier layer 216 may be metal oxides, for example, a crystalline MgO or an amorphous $Al_2O_3$. Other metal oxides suitable for used as the tunneling barrier layer in the MTJ element may also be useful.

The magnetic free layer 217 is disposed on the tunneling barrier layer 216. The magnetic free layer 217 may be a CoFeB layer or a composite layer including CoFeB. The composite layer 217 may include a mono coupling stack or a dual coupling stack. The mono coupling stack includes a coupling layer sandwiched between two magnetic layers, i.e., magnetic layer/coupling layer/magnetic layer configuration. The dual coupling stack includes two mono coupling stacks with a shared magnetic layer in between, i.e., magnetic layer/coupling layer/magnetic layer/coupling layer/ magnetic layer configuration. In one embodiment, the magnetic layer may be CoFeB and the coupling layer may be a metal such as Ta. The thickness of the magnetic layers in the mono coupling stack and dual coupling stack may be substantially the same, whereas the coupling layer may be a thin layer suffices for coupling the magnetic layers.

The composite free layer 217 serves as a magnetic dilution layer for enhancing the perpendicular magnetic anisotropy (PMA) as well as reducing the switching current. Furthermore, the composite free layer 217 also improves the 400° C. thermal budget performance and enables pMTJ process to be compatible with CMOS BEOL process.

For the mono coupling stack, the cap layer 218 is disposed on the free layer 217. The cap layer 218 may be made of Pt, Ru, Ta or other suitable metals. The cap layer 218 protects the underlying free layer 217 and also promotes the PMA in the free layer 217. For the dual coupling stack, a tunneling barrier layer, similar to the tunneling barrier 216, is disposed on the dual coupling stack while the cap layer is disposed on the tunneling barrier layer.

Although the pMTJ stack 200 is illustrated as having a texture breaking layer 214 having first and second spacer layers 214a-214b, it is to be understood that the texture breaking layer may include additional spacer layers which will be described in detail later. Other suitable configurations or materials of the pMTJ stack may also be useful.

Figure 3:
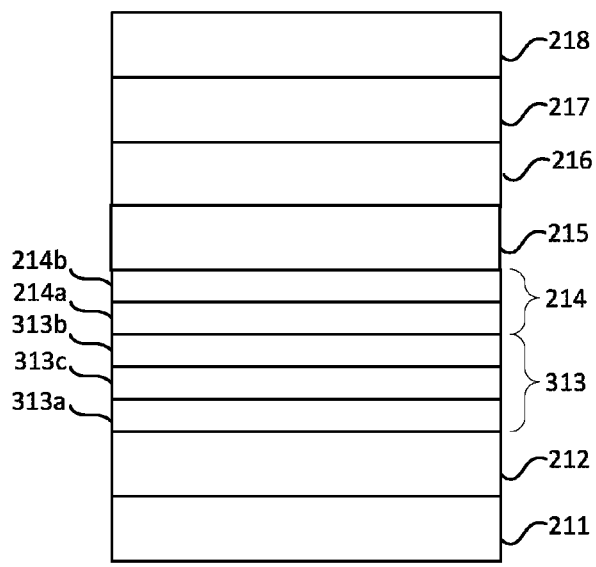
FIG. 3 shows a cross sectional view of an embodiment of a perpendicular MTJ element of a magnetic memory cell.

FIG. 3 shows a simplified cross-sectional view of an embodiment of a pMTJ element or stack 300 along a bitline direction (x-axis). The pMTJ stack 300, for example, is similar to that described in FIG. 2, except for the composition and configuration of the second magnetic layer of the SAF layer. As such, common elements and elements having the same reference numerals may not be described or described in detail.

Referring to FIG. 3, the SAF layer 313 includes first and second magnetic layers 313a-313b and a coupling layer 313c sandwiched between the first and second magnetic layers. The first magnetic layer 313a and the coupling layer 313c in FIG. 3 may include the same materials as the first magnetic layer 213a and the coupling layer 213c as described in FIG. 2. The second magnetic layer 313b of FIG. 3 is different than the second magnetic layer 213b of FIG. 2. In one embodiment, the second magnetic layer 313b of the SAF layer 313 may be a multilayer of cobalt/platinum/cobalt (Co/Pt/Co). The Pt layer sandwiched between the two Co layers serves as a coupling layer to the two Co layers. In one embodiment, the thickness of the two Co layers may be the same, while the Pt layer may be thicker than the Co layers. Other suitable configuration may also be useful, so long as the Pt layer is thicker than the Co layers. Such a composition and configuration of the second magnetic layer 313b enhance the PMA of the SAF layer 313.

Figure 4:
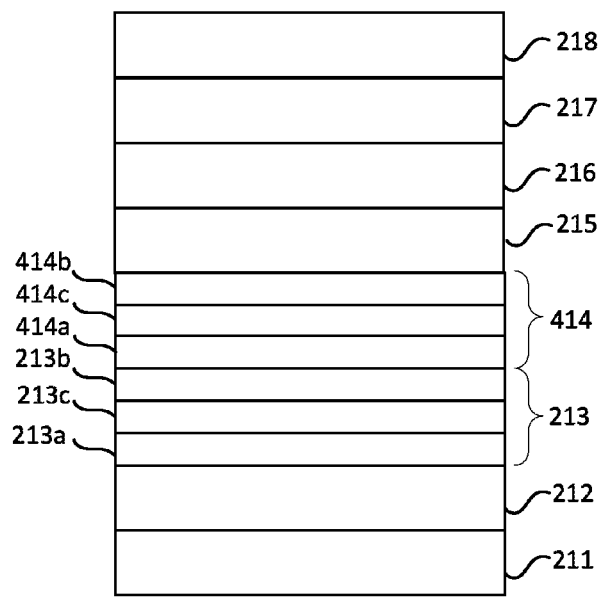
FIG. 4 shows a cross sectional view of an embodiment of a perpendicular MTJ element of a magnetic memory cell.

FIG. 4 shows a simplified cross-sectional view of an embodiment of a pMTJ element or stack 400 along a bitline direction (x-axis). The pMTJ stack 400, for example, is similar to that described in FIG. 2, except for the composition and configuration of the texture breaking layer. As such, common elements and elements having the same reference numerals may not be described or described in detail.

Referring to FIG. 4, the texture breaking layer 414 may be a composite spacer layer including non-magnetic and magnetic layers. The composite spacer layer 414 may include a first spacer layer 414a, a second spacer layer 414b and a third spacer layer 414c. The first spacer layer 414a is proximate to the SAF layer 213. The third spacer layer 414c is sandwiched between the first spacer layer 414a and second spacer layer 414b. In one embodiment, the first spacer layer 414a may be a non-magnetic layer. The non-magnetic layer may be a less diffusive metal, for example, ruthenium (Ru). The secondspacer layer 414b may be a non-magnetic layer. The non-magnetic layer may be a metal, for example, tantalum (Ta). The tantalum layer may, in one embodiment, be an amorphous layer. The third spacer layer 414c may be a magnetic layer, for example, Co or CoFe. Depending on the coupling strength, the thickness of the texture breaking layer may, for example, be 2 to 10 Å.

Such composition and configuration of the texture breaking layer 414 which include non-magnetic and magnetic layers enable the texture breaking layer to function as a magnetically continuous layer and at the same time as a crystallinity discontinuous layer. For example, the magnetic moments present in the magnetic spacer layer enables the texture breaking layer to function as a magnetically continuous layer, allowing for magnetic dilution for low moment. Similar to the configurations of FIGS. 2 and 3, the texture breaking layer 414 governs the growth of the subsequently formed layer. For example, the amorphized Ta spacer layer 414b of the texture breaking layer 414 breaks the texture from underneath, i.e., the crystallinity of the SAF layer 213, enabling the growth of an amorphous layer. Therefore, the subsequently grown layer, i.e., the polarizer layer, is highly disordered, resulting in an enhanced TMR. As a result, the TMR of the MTJ stack is further enhanced.

The Ru spacer layer 414a which is proximate to the SAF layer 213 serves as a boron getter during annealing processes, preventing the formation of borides in the MTJ stack which degrades the device performance. Furthermore, the Ru spacer layer 414a provides a strong coupling between the second magnetic layer 213b of the SAF layer 213 having Co and the magnetic spacer layer 414c which also includes Co. Furthermore, the combination of the Ru spacer layer 414a and Co or CoFe magnetic spacer layer 414c with the Co present in the SAF layer 213 also enhances the perpendicular magnetic anisotropy (PMA) of the SAF layer 213.

The thickness of tantalum spacer layer 414b can be reduced in the presence of the Ru spacer layer 414a in the composite spacer layer 414. Since tantalum is a highly diffusive metal at high annealing temperature, such a reduction in tantalum thickness further ensures the diffusivity of tantalum is reduced. As a result, an improved thermal budget can be achieved and TMR degradation can be avoided.

Figure 5:
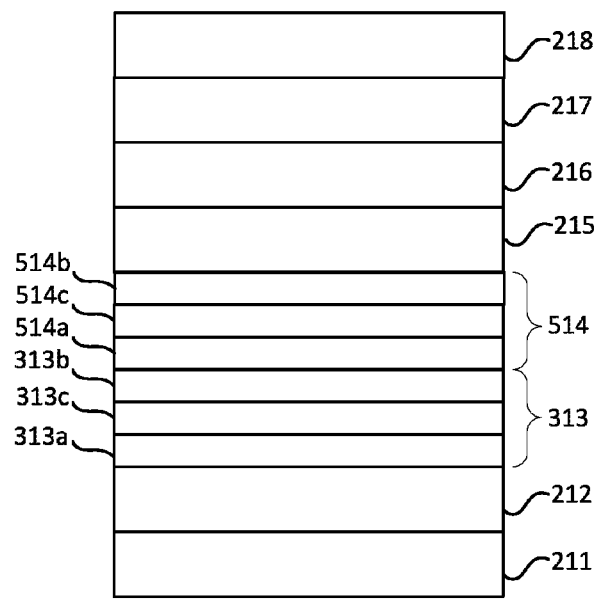
FIG. 5 shows a cross sectional view of an embodiment of a perpendicular MTJ element of a magnetic memory cell.

FIG. 5 shows a simplified cross-sectional view of an embodiment of a pMTJ element or stack 500 along a bitline direction (x-axis). The pMTJ stack 500, for example, is similar to that described in FIG. 3, except for the composition and configuration of the texture breaking layer. As such, common elements and elements having the same reference numerals may not be described or described in detail.

The texture breaking layer 514 of the pMTJ stack 500 is similar to that described in FIG. 4. For example, the texture breaking layer 514 may be a composite spacer layer including non-magnetic and magnetic layers. The composite spacer layer 514 may include a first spacer layer 514a, a second spacer layer 514b and a third spacer layer 514c. The first spacer layer 514a is proximate to the SAF layer 313. The third spacer layer 514c is sandwiched between the first spacer layer 514a and second spacer layer 514b. In one embodiment, the first spacer layer 514a may be a non-magnetic layer, for example, ruthenium (Ru). The second spacer layer 514b may be a non-magnetic layer, for example, tantalum (Ta). The tantalum layer may, in one embodiment, be an amorphous layer. The third spacer layer 514c may be a magnetic layer, for example, Co or CoFe.

Similar to the texture breaking layer 414 of FIG. 4, the texture breaking layer 514 as shown in FIG. 5 which includes non-magnetic and magnetic layers allows it to function as a magnetically continuous layer and at the same time as a crystallinity discontinuous layer.

Figure 6:
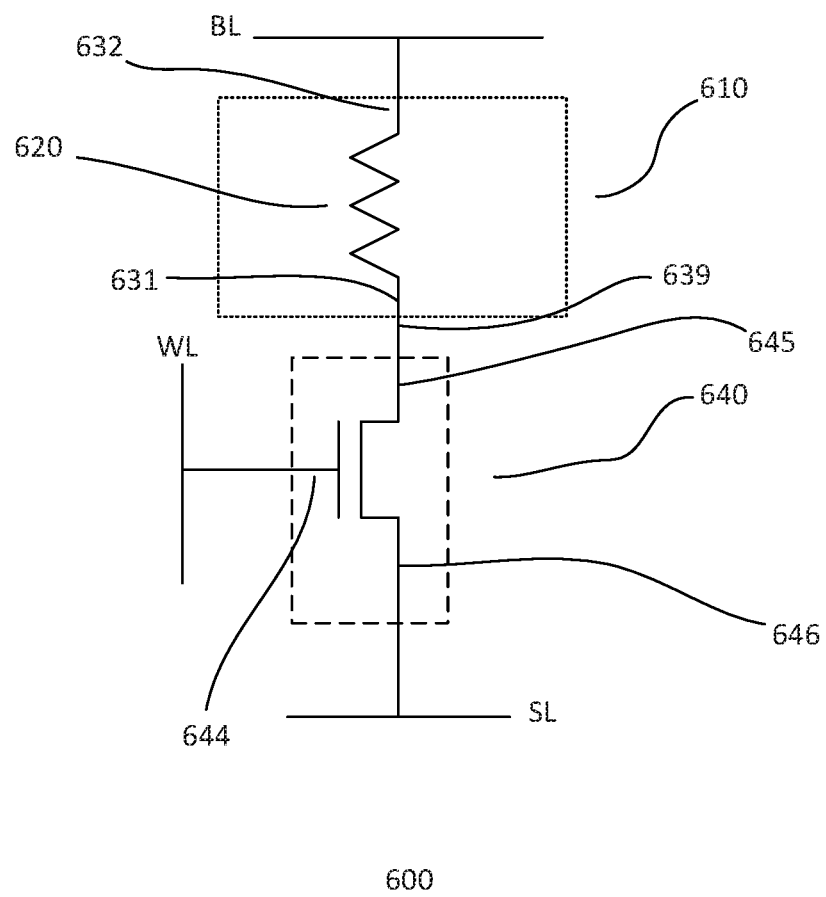
FIG. 6 shows a schematic diagram of an exemplary embodiment of a magnetic memory cell.

FIG. 6 shows a schematic diagram of an embodiment of a memory cell 600. The memory cell is a non-volatile memory (NVM) cell. For example, the memory cell may be a magnetoresistive memory cell. In one embodiment, the memory cell is a Spin Transfer Torque-Magnetoresistive Random Access Memory (STT-MRAM) cell. Other suitable types of memory cells may also be useful. The memory cell includes a storage unit 610 and a cell selector unit 640. The storage unit 610 is coupled to the cell selector unit 640. For example, the storage unit 610 and cell selector unit 640 are coupled at a first cell node 639 of the memory cell. The storage unit 610, in one embodiment, is a magnetic storage unit and includes a pMTJ element 620. The pMTJ element may be similar to that described in FIGS. 2 to 5. Other suitable types of MTJ elements may also be useful.

The pMTJ element includes first and second electrodes 631 and 632. The first electrode 631, for example, may be a bottom electrode while the second electrode 632 may be a top electrode. Other configurations of electrodes may also be useful. In one embodiment, the top electrode 632 of the storage unit 610 is electrically connected to a bit line (BL). The bottom electrode 631 of the storage element is connected to the first cell node 639.

The cell selector unit 640 includes a selector for selecting the memory cell. The selector, for example, may be a select transistor. In one embodiment, the select transistor is a metal oxide semiconductor (MOS) transistor. In one embodiment the selector is a n-type MOS transistor. The select transistor includes first and second source/drain (S/D) terminals 645 and 646 and a gate or control terminal 644. The S/D terminals, for example, are heavily doped regions with first polarity type dopants, defining the first type transistor. For example, in the case of a n-type transistor, the S/D terminals are n-type heavily doped regions. Other types of transistors or selectors may also be useful.

In one embodiment, the first terminal of the cell selector and first electrode 631 of the storage unit 610 are commonly coupled at the first cell node 639. For example, the first S/D terminal 645 of the cell selector is coupled to the bottom electrode 631 of the storage unit 610. The second terminal 646 of the cell selector is coupled to a source line (SL). As for the gate terminal 644, it is coupled to a wordline WL.

Figure 7:
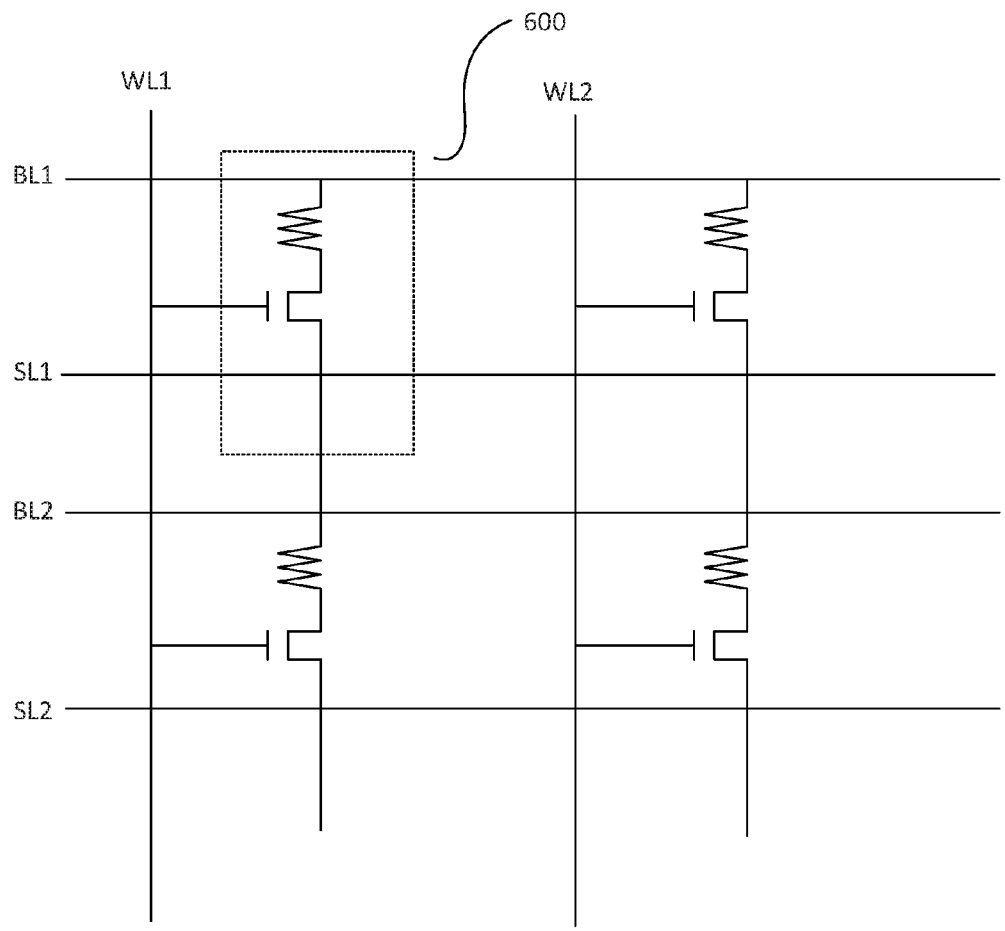
FIG. 7 shows an exemplary array of magnetic memory cells.

FIG. 7 shows a schematic diagram of an embodiment of a memory array 700. The array includes a plurality of memory cells 600 interconnected. The memory cells may be similar to those described in FIG. 6. For example, the memory cells are MRAM cells, such as STT-MRAM cells. Common elements may not be described or described in detail. Other suitable types of memory cells may also be useful.

As shown, the array includes four memory cells arranged in a 2×2 array. For example, the array is arranged to form two rows and two columns of memory cells. Memory cells of a row are interconnected by a wordline (WL1 or WL2) while memory cells of a column are interconnected by a bitline (BL1 or BL2). A S/D terminal is coupled to a source line (SL1 or SL2). Other suitable cell configurations may also be useful. Although the array is illustrated as a 2×2 array, it is understood that arrays of other sizes may also be useful.

Figure 8:
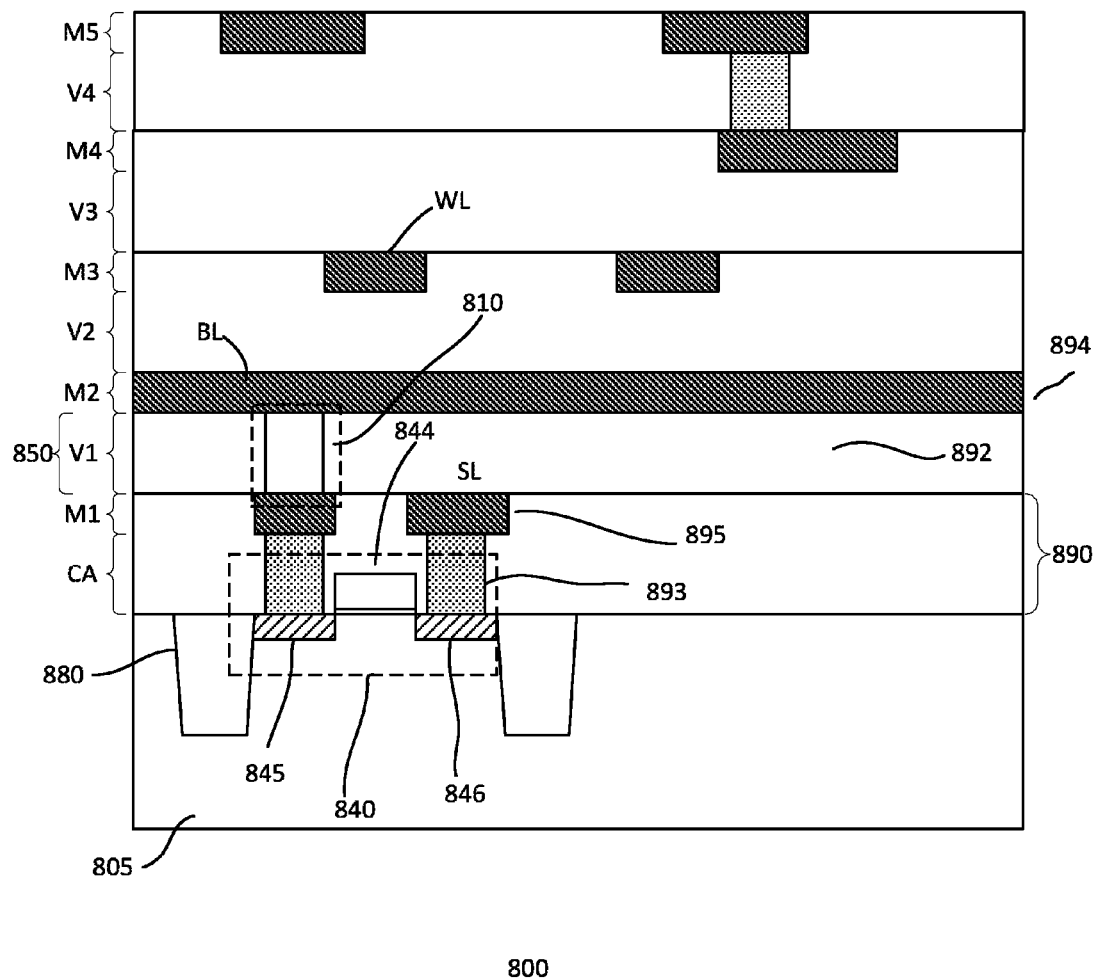
FIG. 8 shows a cross-sectional view of an embodiment of a device.

FIG. 8 shows a cross-sectional view of an exemplary embodiment of a memory cell 800 of a device. The cross-sectional view, for example, is along a second or bitline direction of the device. The device, as shown, includes a memory cell 800. The memory cell, for example, may be a NVM memory cell. The memory cell, in one embodiment, is a magnetoresistive NVM cell, such as a STT-MRAM cell. The memory cell, for example, includes a pMTJ stack which is the same or similar to that described in FIGS. 2 to 5. Common elements or elements having the same reference numerals may not be described or described in detail.

The memory cell is disposed on a substrate 805. For example, the memory cell is disposed in a cell region of the substrate 805. The cell region may be part of an array region. For example, the array region may include a plurality of cell regions. The substrate 805 may include other types of device regions (not shown), such as high voltage (HV) as well as logic regions, including low voltage (LV) and intermediate voltage (IV) device regions. Other types of regions may also be provided.

The substrate 805, for example, is a semiconductor substrate, such as a silicon substrate. For example, the substrate 805 may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate 805 may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front-end-of-line (FEOL) processing is performed on the substrate 805. The FEOL process, for example, forms n-type and p-type devices or transistors on the substrate 805. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

Isolation regions, for example, serve to isolate different device regions. The isolation regions may be shallow trench isolation (STI) region. To form STI regions, trenches are formed and filled with isolation material. A planarization process, such as chemical mechanical polishing (CMP) is performed to remove excess dielectric material, forming isolation regions. Other types of isolation regions may also be useful. The isolation regions are provided to isolate device regions from other regions.

Device wells, for example, serve as bodies of p-type and n-type transistors. Device wells are doped wells. Second type doped device wells serve as bodies of first type transistors. For example, p-type device wells serve as bodies of n-type transistors and n-type device wells serve as bodies of p-type transistors. Isolation wells may be used to isolate device wells from the substrate. The isolation wells are deeper than the device wells. For example, isolation wells encompass the device wells. The isolation wells are first type doped wells. For example, n-type isolation wells are used to isolate p-type device wells. Separate implants may be employed to form different doped device wells and isolation wells using, for example, implant masks, such as photoresist masks. The wells, for example, are formed after forming isolation regions.

Gates of transistors are formed on the substrate. For example, layers of the gate, such as gate dielectric and gate electrode are formed on the substrate and patterned to form the gates. The gate dielectric may be a silicon oxide layer while the gate electrode layer may be polysilicon. The gate electrode may be doped, for example, to reduce sheet resistance. Other types of gate dielectric and gate electrode layers may also be useful. The gate dielectric layer may be formed by thermal oxidation and the gate electrode layer may be formed by chemical vapor deposition (CVD). Separate processes may be performed for forming gate dielectrics of the different voltage transistors. This is due to, for example, different gate dielectric thicknesses associated with the different voltage transistors. For example, HV transistor will have a thicker gate dielectric than a LV transistor.

The gate layers are patterned by, for example, mask and etch techniques. For example, a patterned photoresist mask may be provided over the gate layers. For example, a photoresist layer is formed over the gate layers and lithographically exposed by using a reticle. The photoresist mask layer is developed, forming a patterned photoresist mask with the desired pattern of the reticle. To improve lithographic resolution, an anti-reflective coating (ARC) layer may be provided between the gate electrode layer and photoresist mask layer. An anisotropic etch, such as a reactive ion etch (RIE) is used to pattern the gate layers to form the gates using the patterned photoresist mask.

Doped contact regions, such as source/drain (S/D) regions and well or substrate taps are formed in exposed active regions of the substrate 805 after forming the gates. The contact regions are heavily doped regions. Depending on the type of transistor and well tap, the contact regions may be heavily doped n-type or p-type regions. For n-type transistors, S/D regions are heavily doped n-type regions and for p-type transistors, S/D regions are heavily doped p-type regions. For well taps, they are the same dopant type as the well.

A S/D region may include lightly doped diffusion (LDD) and halo regions. A LDD region is a lightly doped region with first polarity type dopants while the halo region is a lightly doped region with second polarity type dopants. For example, the halo region includes p-type dopants for a n-type transistor while the LDD region includes n-type dopants for n-type transistors. The halo and LDD regions extend under the gate. A halo region extends farther below the gate than a LDD region. Other configurations of LDD, halo and S/D regions may also be useful.

Dielectric spacers (not shown) may be provided on the gate sidewalls of the transistors. The spacers may be used to facilitate forming transistor halo, LDD and transistor S/D regions. For example, spacers are formed after halo and LDD regions are formed. Spacers may be formed by, for example, forming a spacer layer on the substrate and anisotropically etching it to remove horizontal portions, leaving the spacers on sidewalls of the gates. After forming the spacers, an implant is performed to form the S/D regions. Separate implants may be employed to form different doped regions using, for example, implant masks, such as photoresist mask. Well taps of the same dopant type as S/D regions are formed at the same time.

As shown, the FEOL processing forms a cell region isolated by an isolation region 880, such as a STI region. The cell region is for a memory cell. Isolation regions may be provided to isolate columns of memory cells. Other configurations of isolation regions may also be useful. The cell region may include a cell device well (not shown). The cell device well, for example, serves as a body well for a transistor of the memory cell. The device well may be doped with second polarity type dopants for first polarity type transistors. The device well may be lightly or intermediately doped with second polarity type dopants. In some cases, a cell device isolation well (not shown) may be provided, encompassing the cell device well. The isolation well may have a dopant type which has the opposite polarity to that of the cell device well. For example, the isolation well may include first polarity type dopants. The isolation well serves to isolate the cell device well from the substrate. Well biases may be provided to bias the wells.

The cell device well may be a common well for the cell regions in the array region. For example, the cell device well may be an array well. The cell device isolation well may serve as the array isolation well. Other configurations of device and isolation wells may also be useful. Other device regions of the device may also include device and/or device isolation wells.

The memory cell includes a cell selector unit 840 and a storage unit 810. The FEOL forms the cell selector unit 840 in the cell region. The cell selector unit 840 includes a selector for selecting the memory cell. The selector, for example, may be a select transistor. In one embodiment, the select transistor is a metal oxide semiconductor (MOS) transistor. The transistor, as shown, includes first and second source/drain (S/D) regions 845 and 846 formed in the substrate 805 and a gate 844 disposed on the substrate between the S/D regions. The first S/D region 845 may be referred to as a drain region and the second S/D region 846 may be referred to as a source region. The S/D regions, for example, are heavily doped regions with first polarity type dopants, defining the first type transistor. For example, in the case of a n-type transistor, the S/D regions are n-type heavily doped regions. Other types of transistors or selectors may also be useful.

As for the gate 844, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a first or wordline direction. The gate conductor forms a common gate for a row of memory cells.

As discussed, a S/D region may include LDD and halo regions (not shown). Dielectric spacers (not shown) may be provided on the gate sidewalls of the transistors to facilitate forming transistor halo, LDD and transistor S/D regions. It is understood that not all transistors include LDD and/or halo regions.

After forming the cell selector unit 840 and other transistors, back-end-of-line (BEOL) processing is performed. The BEOL process includes forming interconnects in inter-level dielectric (ILD) layers 890. The interconnects connect the various components of the IC to perform the desired functions. An ILD layer includes a metal level 894 and a contact level 892. Generally, the metal level 894 includes conductors or metal lines 895 while the contact level 892 includes contacts 893. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a pre-metal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive material, leaving contact plugs in the CA level.

After forming contacts 893 in the CA level, the BEOL process continues to form dielectric layer over the substrate 805, covering the CA level dielectric layer. The dielectric layer, for example, serves as a first metal level M1 of the first ILD layer. The upper dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 dielectric. The first metal level M1 and CA may be referred as a lower ILD level.

The process continues to form additional ILD layers. For example, the process continues to form upper ILD layers or levels. The upper ILD levels may include ILD level 2 to ILD level x. For example, in the case where x=5 (5 levels), the upper levels include ILD levels from 2 to 5, which includes M2 to M5. The number of ILD layers may depend on, for example, design requirements or the logic process involved. The upper ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an upper ILD layer.

A dielectric liner (not shown) may be disposed between ILD levels and on the substrate 805. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD which is 2× or 6× the CD of the metal levels below. Other configurations of the ILD levels may also be useful.

As shown, S/D contacts 893 are disposed in the CA level. The S/D contacts are coupled to the first and second S/D regions of the select transistor. Other S/D contacts coupled to other S/D regions of transistors may also be provided. The CA level may include a gate contact (not shown) coupled to the gate of the select transistor. The gate contact may be disposed in another cross-section of the device. The contacts may be tungsten contacts while contact pads may be copper. Other types of contacts and contact pad may also be useful. Other S/D and gate contacts for other transistors may also be provided.

As described, metal lines are provided in M1. The metal lines are coupled to the S/D contacts 893. In one embodiment, a SL is coupled to the second S/D region 846 of the select transistor. As for the first S/D contact 845, it may be coupled to contact pad or island in M1. The contact pads provide connections to upper ILD levels. The metal lines or pads may be formed of copper or copper alloy. Other types of conductive material may also be useful.

As for the upper ILD, for example, from 2 to 5, they include contacts in the via level and contact pads/metal lines in the metal level. The contacts and contact pads provide connection from M5 to the first S/D region 845 of the select transistor.

A pad level (not shown) is disposed over the uppermost ILD level. For example, a pad dielectric level is disposed over Mx. In the case where the device includes 5 metal levels, the pad level is disposed over M5. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

A dielectric liner may be disposed between the uppermost metal level and pad level. The dielectric liner, for example, serves as an etch stop layer during via etch process and it may also serve as a diffusion barrier layer for, for example, copper (Cu) layer. The dielectric liner may be a low k dielectric liner. For example, the dielectric liner may be nBLOK. Other suitable types of dielectric materials for the dielectric liner may also be useful.

The storage unit 810 of the memory cell is disposed in a storage dielectric layer 850. The storage dielectric layer 850 may be a via level of an ILD level. As shown, the storage dielectric layer 850 is V1. Providing the storage dielectric layer at other via levels may also be useful. In other embodiments, the storage dielectric layer 850 may be a dedicated storage dielectric layer and not part of an interconnect level. Other configurations of storage dielectric layer may also be useful. The storage unit 810 includes a storage element disposed between bottom and top electrodes, forming a pMTJ element. The storage element, in one embodiment, is a bottom pinned pMTJ storage element, such as that described in FIGS. 1 to 5. Common elements may not be described or described in detail.

In one embodiment, the bottom electrode of the storage unit is coupled to a drain of the select transistor. For example, the bottom electrode is coupled to a contact pad in the M1 level and a via contact in the CA level. Other configurations of coupling the bottom electrode may also be useful. The top electrode is coupled to a BL. For example, the top electrode is coupled to the BL disposed in M2. The BL is along a bitline direction. As for the source of the select transistor, it is coupled to a SL. For example, a via contact in CA is provided to couple the source region of the select transistor to SL in M1. Providing SL in other levels may also be useful.

As for the gate of cell selector, it is coupled to a WL. The WL, for example, is along a wordline direction. The bitline and wordline directions are perpendicular to each other. As shown, the WL is disposed in M3. The WL may be coupled to the gate by contact pads in M2 and M1 and via contacts in V2 and V1 (not shown). Other configurations of coupling the WL to the gate may also be useful. For example, the WL may be disposed in other metal levels.

Although as described, the various lines and storage element are disposed in specified dielectric levels of the backend dielectric levels, other configurations may also be useful. For example, they may be disposed in other or additional metal levels. For example, the storage element may be provided in an upper via level, such as between M5 and M6. Furthermore, the device may also include other device regions and components.

FIGS. 9a-9h show simplified cross-sectional views of an embodiment of a process 900 for forming a device. The process includes forming a memory cell. The memory cell, for example, may be a NVM memory cell. The memory cell, in one embodiment, is a magnetoresistive NVM cell, such as a STT-MRAM cell. The memory cell, for example, is similar to that described in FIG. 8. Common elements may not be described or described in detail. The cross-sectional views, for example, are along the bitline direction. Although the cross-sectional views show one memory cell, it is understood that the device includes a plurality of memory cells of, for example, a memory array. In addition, the memory cell can be formed simultaneously with CMOS logic devices on the same substrate.

The simplified cross-sectional views illustrate an upper ILD level 990. For example, a substrate (not shown) has been processed with FEOL and BEOL processing, as already described, to include the upper ILD level. FEOL processing, for example, forms transistors, including a select transistor of the memory cell. Other types of devices may also be formed on the same substrate. BEOL processing forms interconnects in ILD levels. The upper ILD level includes and a via level 992 and a metal level 994. For example, the upper ILD level includes V4 and M5. The via level, as shown, includes a via contact 993 while the metal level includes interconnects. For example, interconnect 995b is a cell contact pad for coupling to a storage unit and interconnect 995a is coupled to a pad interconnect. The interconnects, for example, are copper interconnects. Other suitable types of interconnects may also be useful.

Referring to FIG. 9a, a dielectric liner 958, in one embodiment, is disposed above the metal level. The dielectric liner, for example, serves as an etch stop layer. The dielectric liner may be a low k dielectric liner. For example, the dielectric liner may be nBLOK. Other types of dielectric materials for the dielectric liner may also be useful. The dielectric liner, for example, is formed by CVD. Other suitable techniques for forming the dielectric liner may also be useful.

The process continues to form a dielectric layer. As shown in FIG. 9b, a lower dielectric layer 960 is formed on the dielectric liner 958. The lower dielectric layer, in one embodiment, includes oxide material. The lower dielectric layer may be formed by CVD. Other suitable forming techniques or suitable thicknesses for the lower dielectric layer may also be useful.

In FIG. 9c, the lower dielectric layer 960 and the dielectric liner 958 are patterned to form a storage unit opening 964. The storage unit opening 964, for example, is a via opening for accommodating a lower portion of a subsequently formed storage stack. The storage unit opening 964 exposes a cell contact pad 995b in the metal level below. The opening may be formed by mask and etch techniques. For example, a patterned photoresist mask may be formed over the lower dielectric layer, serving as an etch mask. An etch, such as RIE, may be performed to pattern the lower dielectric layer using the patterned resist etch mask. In one embodiment, the etch transfers the pattern of the mask to the lower dielectric layer, including the dielectric liner to expose the contact pad 995b below.

Referring to FIG. 9d, the process continues to form a storage stack. The storage stack may be a magnetic storage stack. The magnetic storage stack is, for example, a MTJ stack, similar to those describe in FIGS. 2-5. The MTJ stack may include various layers configured as a bottom pinned MTJ stack similar to those described in FIGS. 2-5. The MTJ stack forms a storage unit of a MRAM cell.

The MTJ stack, for example, includes a storage stack disposed between top and bottom electrodes. The bottom electrode is coupled to a contact pad in the metal level below. For example, the bottom electrode is coupled to the contact pad 995b in M5. This provides connections of the MTJ stack to the first SD) region 845 of the cell select transistor as described in FIG. 8. As for the top electrode, it is exposed at the top of an intermediate dielectric layer.

The various layers of the MTJ stack are formed on the substrate. For example, the various layers of the MTJ stack are sequentially formed over the lower dielectric layer 960 and filling the opening. After the opening 964 is formed, a bottom electrode layer 931, such as Ta or TaN is deposited over the lower dielectric layer and fills the opening as shown in FIG. 9*d*. A chemical mechanical polishing (CMP) process is applied to form an embedded bottom electrode in the opening 964 and remove excess bottom electrode layer in other areas. Other suitable bottom electrode materials and techniques may be employed. The bottom electrode 931 fills the opening and the surface is flat as shown in FIG. 9*e*. The process continues to form remaining layers of the MTJ stack, such as the storage stack 920 and the top electrode 932, on top of the bottom electrode by physical vapor deposition (PVD) process.

The layers of the MTJ stack are patterned to form the MTJ stack 930 as shown in FIG. 9*f*. Patterning the layers maybe achieved with a non-conducting mask and etch techniques. After forming the MTJ element 930, the non-conducting mask layer used to pattern the MTJ stack is removed if dielectric ARC or oxide hard mask layer is used. Other suitable techniques for forming the MTJ stack may also be useful.

In one embodiment, the substrate is subject to an alloying process. The alloying process includes annealing the substrate to around 400° C. with duration of about 1-2 hours and with hydrogen ambient. Other suitable temperature, duration and ambient may be also used. The alloying process is applied to passivate dangling bonds in gate oxide and consequently improve device performance and reliability.

Figure 9G:
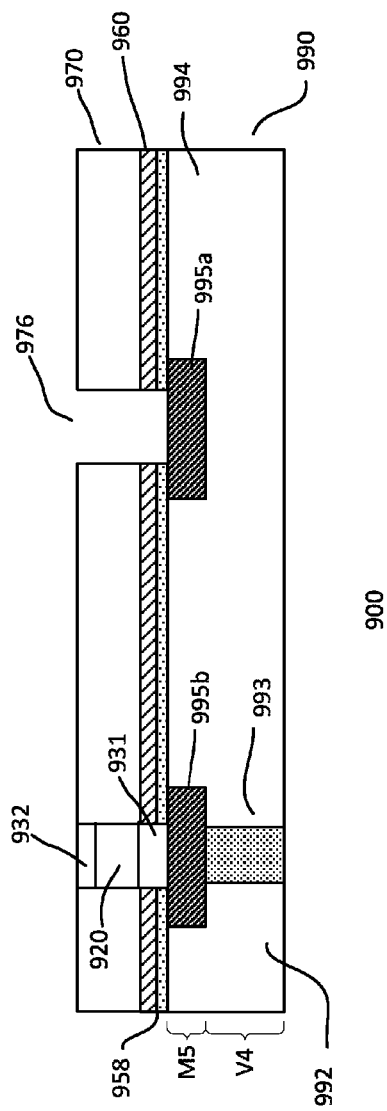

An intermediate dielectric layer 970 which serves as a storage dielectric layer is formed on the substrate, as shown in FIG. 9*g*. The dielectric layer is formed over the lower dielectric layer 960 and sufficiently covers the MTJ stack. The intermediate dielectric layer, for example, is silicon oxide. Other types of intermediate dielectric layers may also be useful. The intermediate dielectric layer may be formed by CVD. Other techniques for forming the dielectric layer may also be useful.

A planarizing process is performed on the substrate, planarizing the intermediate dielectric layer. The planarizing process, for example, is a CMP process. The CMP produces a planar top surface between the top of the MTJ stack and intermediate dielectric layer. The intermediate and lower dielectric layers are patterned to form a via opening 976. The via opening is patterned by mask and etch techniques. The via opening penetrates through the various dielectric layers and the dielectric liner. This exposes the interconnect 995*a* in the lower metal level. After forming the via opening, the mask layer is removed. For example, the mask and ARC layers are removed.

Figure 9H:
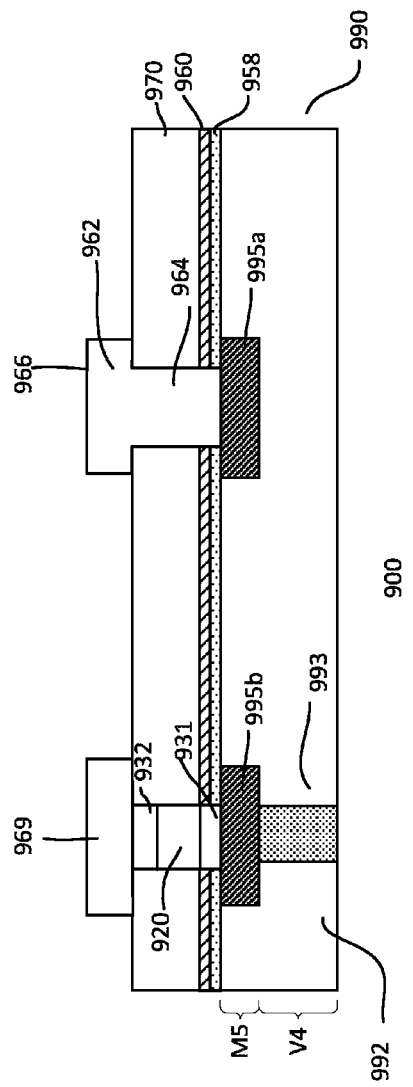

Referring to FIG. 9*h*, a conductive layer is formed on the substrate. The conductive layer covers the intermediate dielectric layer and MTJ stack as well as filling the via opening. The conductive layer, for example, includes a copper layer. Other suitable types of conductive layers may also be useful. The conductive layer may be formed by, for example, sputtering. Other suitable techniques for forming the conductive layer may also be useful.

The conductive layer is patterned to form a metal line 969 and an interconnect 966. Patterning the conductive layer to form the metal line and interconnect may be achieved by mask and etch techniques. For example, a patterned photoresist mask may be formed over the conductive layer. An etch, such as RIE, may be used to pattern the conductive layer with a patterned resist mask. In one embodiment, the interconnect 966 includes a via contact 964 in the via opening and a contact pad 962 over the intermediate dielectric layer 970. The metal line 969, for example, may serve as the BL. After patterning the conductive layer, the mask layer is removed. For example, the mask and ARC layers are removed.

Additional processes may be performed to complete forming the device. For example, the processes may include forming additional ILD levels, pad level, passivation level, pad opening, dicing, assembly and testing. Other types of processes may also be performed.

Although the storage stack of the memory cell as described above includes a MTJ stack such as that shown in FIGS. 2 to 5, it is understood that other suitable configurations of MTJ stack and other types of MTJ stack may be used. In addition, the process as described in FIGS. 9*a*-9*h* is also applicable to other suitable types of memory cell, such as but not limited to memory cells which are sensitive to high temperature processing.

The embodiments as described result in various advantages. For example, the alloying process performed at high temperature, such as 400° C. is important to maintain the performance and reliability of devices other than the MTJ stack. In the embodiments as described, the provision of the texture breaking layer having the composite spacer layer improves the thermal budget and is compatible with the alloying process. For example, the composite layer includes a less diffusive metal (Ru spacer layer) which reduces the thickness of the Ta spacer layer. Since tantalum is a highly diffusive metal at high annealing temperature, such a reduction in tantalum thickness further ensures the diffusivity of tantalum is reduced. As a result, an improved thermal budget and TMR can be achieved. The composite spacer layer which includes the Ru spacer layer improves the PMA of the second magnetic layer of the SAF layer adjacent thereto and further reduces the overall thickness of the second magnetic layer of the SAF layer. This could lead a minimized pMTJ stack. In some embodiments where the texture breaking layer includes non-magnetic and magnetic layers, such configuration enables the texture breaking layer to function as a magnetically continuous layer and at the same time as a crystallinity discontinuous layer. Moreover, the process as described is highly compatible with logic processing or technology.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A method of forming a device comprising:
 providing a substrate comprising circuit component formed on a substrate surface;
 performing back end of line processing to form an upper inter level dielectric (ILD) layer over the substrate, wherein the upper ILD layer comprises a plurality of ILD levels;

forming a magnetic tunneling junction (MTJ) stack in between adjacent ILD levels of the upper ILD layer, wherein the MTJ stack comprises
a free layer,
a tunneling barrier layer, and
a fixed layer, wherein the fixed layer comprises
a polarizer layer,
a composite texture breaking layer comprising an amorphous layer and a non-magnetic layer, the amorphous layer is disposed above the non-magnetic layer,
a synthetic antiferromagnetic (SAF) layer
wherein the composite texture breaking layer is disposed above the SAF layer, the polarizer layer is disposed above the composite texture breaking layer, the tunneling barrier layer is disposed above the polarizer layer and the free layer is disposed above the tunneling barrier layer, and
wherein the composite texture breaking layer breaks a crystalline texture of the SAF layer.

2. The method of claim 1 wherein the SAF layer comprises a first magnetic layer, a second magnetic layer and a coupling layer, wherein the coupling layer is sandwiched between the first and second magnetic layers, and wherein the second magnetic layer is proximate to the texture breaking layer.

3. The method of claim 2 wherein:
the first magnetic layer comprises n multilayer of cobalt/platinum (Co/Pt), cobalt/palladium (Co/Pd) or cobalt/nickel (Co/Ni); and
the second magnetic layer comprises m multilayer of cobalt/platinum (Co/Pt), cobalt/palladium (Co/Pd) or cobalt/nickel (Co/Ni), and
wherein n is an integer larger than m.

4. The method of claim 2 wherein:
the first magnetic layer comprises a multilayer of cobalt/platinum (Co/Pt), cobalt/palladium (Co/Pd) or cobalt/nickel (Co/Ni); and
the second magnetic layer comprises a multilayer of cobalt/platinum/cobalt (Co/Pt/Co).

5. The method of claim 4 wherein a layer of Co/Pt/Co of the second magnetic layer comprises a platinum layer sandwiched between two cobalt layers, wherein the platinum layer is thicker than the cobalt layer.

6. The method of claim 3 wherein the non-magnetic layer comprises a ruthenium layer, and wherein the ruthenium layer is proximate to the SAF layer.

7. The method of claim 6 wherein the amorphous layer comprises a tantalum layer.

8. The method of claim 7 wherein the composite texture breaking layer further comprises a cobalt or cobalt iron (CoFe) alloy layer, and wherein the cobalt or CoFe alloy layer is sandwiched between the tantalum layer and ruthenium layer.

9. The method of claim 4 wherein the non-magnetic layer comprises a ruthenium layer, and wherein the ruthenium layer is proximate to the SAF layer.

10. The method of claim 9 wherein the amorphous layer comprises a tantalum layer.

11. The method of claim 10 wherein the composite texture breaking layer further comprises a cobalt or cobalt iron (CoFe) alloy layer, and wherein the cobalt or CoFe alloy layer is sandwiched between the tantalum layer and ruthenium layer.

12. The method of claim 1 wherein forming the MTJ stack in between adjacent ILD levels comprises:

forming an opening in a lower dielectric layer of a lower ILD level of the adjacent ILD levels;
forming a bottom electrode layer over the lower dielectric layer and fills the opening;
planarizing the bottom electrode layer to form bottom electrode in the opening and removing excess bottom electrode layer in areas other than the opening;
depositing remaining MTJ stack layers over the lower dielectric layer and the bottom electrode; and
patterning the remaining MTJ stack layers to form the MTJ stack and a top electrode of the MTJ stack over the bottom electrode.

13. The method of claim 12 where depositing the remaining MTJ stack layers comprises sequentially depositing the fixed layer, the tunneling barrier layer, the free layer and a top electrode layer over the lower dielectric layer and the bottom electrode.

14. The method of claim 13 comprising:
forming an intermediate dielectric layer over the lower dielectric layer and covers the patterned MTJ stack; and
performing a planarizing process to form planar top surface between top of the MTJ stack and the intermediate dielectric layer.

15. The method of claim 11 further comprising forming a metal line over the intermediate dielectric layer, wherein the metal line is coupled to the MTJ stack.

16. A device comprising:
a substrate comprising circuit component disposed over a substrate surface;
an upper inter level dielectric (ILD) layer disposed over the substrate, wherein the upper ILD layer comprises a plurality of ILD levels; and
a magnetic tunneling junction (MTJ) stack disposed in between adjacent ILD levels of the upper ILD layer, wherein the MTJ stack comprises
a free layer,
a tunneling barrier layer, and
a fixed layer, wherein the fixed layer comprises
a polarizer layer,
a composite texture breaking layer comprising an amorphous layer and a non-magnetic, the amorphous layer is disposed above the non-magnetic layer,
a synthetic antiferromagnetic (SAF) layer
wherein the composite texture breaking layer is disposed above the SAF layer, the polarizer layer is disposed above the composite texture breaking layer, the tunneling barrier layer is disposed above the polarizer layer and the free layer is disposed above the tunneling barrier layer, and
wherein the composite texture breaking layer breaks a crystalline texture of the SAF layer.

17. The device of claim 16 wherein the SAF layer comprises a first magnetic layer, a second magnetic layer and a coupling layer, wherein the coupling layer is sandwiched between the first and second magnetic layers.

18. The device of claim 17 wherein the composite texture breaking layer further comprises a cobalt or cobalt iron (CoFe) alloy layer.

19. The device of claim 18 wherein the non-magnetic layer comprises a ruthenium layer.

20. The device of claim 19 wherein the amorphous layer comprises a tantalum layer.

* * * * *